United States Patent
Bayart et al.

[19]

[11] Patent Number: 5,815,299
[45] Date of Patent: Sep. 29, 1998

[54] METHOD AND SYSTEM FOR EQUALIZING RESPECTIVE POWER LEVELS OF CHANNELS OF A RECEIVED OPTICAL FREQUENCY DIVISION MULTIPLEXED SIGNAL

[75] Inventors: Dominique Bayart, Clamart; Bertrand Desthieux, Paris, both of France

[73] Assignee: Alcatel N.V., Rijswijk, Netherlands

[21] Appl. No.: 709,152

[22] Filed: Sep. 6, 1996

[30] Foreign Application Priority Data

Sep. 8, 1995 [FR] France .................................. 95 10548

[51] Int. Cl.⁶ .................................................. H04B 10/00
[52] U.S. Cl. ........................ 359/171; 359/124; 359/161; 359/176; 359/179
[58] Field of Search .................................. 359/124, 125, 359/161, 171, 176, 179; 333/28 R, 16

[56] References Cited

U.S. PATENT DOCUMENTS

| | | | |
|---|---|---|---|
| 4,238,648 | 12/1980 | Epworth | 359/179 |
| 5,077,728 | 12/1991 | Kaminou | 352/124 |
| 5,260,823 | 11/1993 | Payne et al. | 359/341 |
| 5,276,543 | 1/1994 | Olshansky | 359/124 |
| 5,278,687 | 1/1994 | Jannson et al. | 359/125 |
| 5,500,756 | 3/1996 | Tsushina et al. | 359/174 |

FOREIGN PATENT DOCUMENTS

| | | |
|---|---|---|
| 4147114 | 5/1992 | Japan . |
| 4204719 | 7/1992 | Japan . |

OTHER PUBLICATIONS

Kyo Inoue et al, "Tunable Gain Equalization Using a Mach–Zender Optical Filter in Multistage Fiber Amplifiers", *IEEE Photonics Technology Letters*, vol. 3, No. 8, Aug. 1, 1991, pp. 718–720.

*Primary Examiner*—Edward Lefkowitz
*Attorney, Agent, or Firm*—Sughrue, Mion, Zinn, Macpeak & Seas, PLLC

[57] ABSTRACT

A method for equalizing power levels of channels of an optical frequency division multiplexed signal determines the power level of each channel of the optical frequency division multiplexed signal and introduces attenuation into the channels having high power levels corresponding to the difference between a level deduced from these high levels and a low reference level. The equalization system includes at least one optical equalizer module which measures the optical power levels of the channels of the signal to be monitored, a processor for implementing the method and variable attenuators controlled by the processor and operating separately on the power levels of the channels.

12 Claims, 1 Drawing Sheet

METHOD AND SYSTEM FOR EQUALIZING RESPECTIVE POWER LEVELS OF CHANNELS OF A RECEIVED OPTICAL FREQUENCY DIVISION MULTIPLEXED SIGNAL

BACKGROUND OF THE INVENTION

1. Field of the Invention

The invention concerns a method and a system for equalizing respective power levels of channels of a received optical frequency division multiplexed signal transmitted over an amplified link.

2. Description of the Prior Art

Long distance transmission links include amplifiers for regenerating the transmitted signal distributed regularly along the length of the links.

When an optical frequency division multiplexed signal is transmitted over an amplified link of this kind, it is preferable for the respective power levels of its various channels to be and to remain virtually identical throughout. Otherwise, in the absence of any specific measure to the contrary, the power level of the lowest power channel of a signal tends to be reduced relative to the power levels of the other channels of the signal as the signal is transmitted through the optical amplifiers along the link in question. The signal/noise ratio and the dynamic range for the lowest power channel can then become insufficient for correct exploitation of the signal part corresponding to that channel at the output of the link.

One solution to this problem is given in the document "Self-regulating WDM amplifier module for scaleable lightwave networks" by E. L. GOLDSTEIN et al published in the 1994 technical abstract "Optical amplifiers and their applications", volume 14, BRECKENBRIDGE, Colo., August 1994. This self-regulating amplifier is designed to prevent channels that are not in the peak gain area of the optical amplifiers of a transmission link from falling to a power level that is too low so that the corresponding parts of the transmitted signal become unusable. It includes individual optical amplifiers with shared pumping for the various channels disposed between a demultiplexer receiving the optical frequency division multiplexed signal as transmitted and a multiplexer reconstituting that signal from the output of the individual optical amplifiers connected in parallel for onward transmission over the link concerned. A self-regulating amplifier of this kind that balances the power levels for the various channels of an optical frequency division multiplexed signal has the disadvantage of introducing relatively high losses both when demultiplexing the received signal and when multiplexing the transmitted signal, the consequence of which is significant deterioration of the signal/noise ratio of the transmitted signal.

SUMMARY OF THE INVENTION

The invention therefore consists in a method of equalizing respective power levels of channels of an optical frequency division multiplexed signal, including the following operations:

determining the power level of each channel of said optical frequency division multiplexed signal;

introducing attenuation into the channels having power levels that are high relative to a reference level corresponding either to the power level of the channel having the lowest power level or to a level determined from the power levels of the channels having power levels near to that of the channel having the lowest power level, the attenuation applied to the channels having high power levels corresponding to the difference between a power level deduced from the power levels of said channels having high power levels and said reference level.

The invention also proposes a system for equalizing power levels of channels of an optical frequency division multiplexed signal received and transmitted, including at least one optical equalizer module including:

means for measuring optical power levels of channels of an optical frequency division multiplexed signal that said module receives and transmits;

processing means for determining which channel of the received optical signal has the lowest power level for the purpose of determining a reference level corresponding either to said lowest power level or to a level determined from channels having power levels near said lowest power level, to determine at least one attenuation value to be applied to the channels having high power levels from the difference between a power level deduced from the power levels of said channels having high power levels and the reference level, if said difference is greater than a given threshold value;

variable attenuation means controlled by the processing means and adapted to operate separately on the power levels of the optical signal channels and to introduce the attenuation determined by the processing means into each of the channels for which high power levels have been measured, the measuring means being connected to the processing means to which they supply the measured power level of each channel, the processing means being connected to the attenuator means via interface means for operating on the attenuation means so that all of the channels are finally at a power level that is at least approximately the same, on the downstream side of said attenuation means.

The invention, its features and its advantages are explained in the following description with reference to the figures listed below.

DETAILED DESCRIPTION OF THE PREFERRED EMBODIMENT

Figure 1:
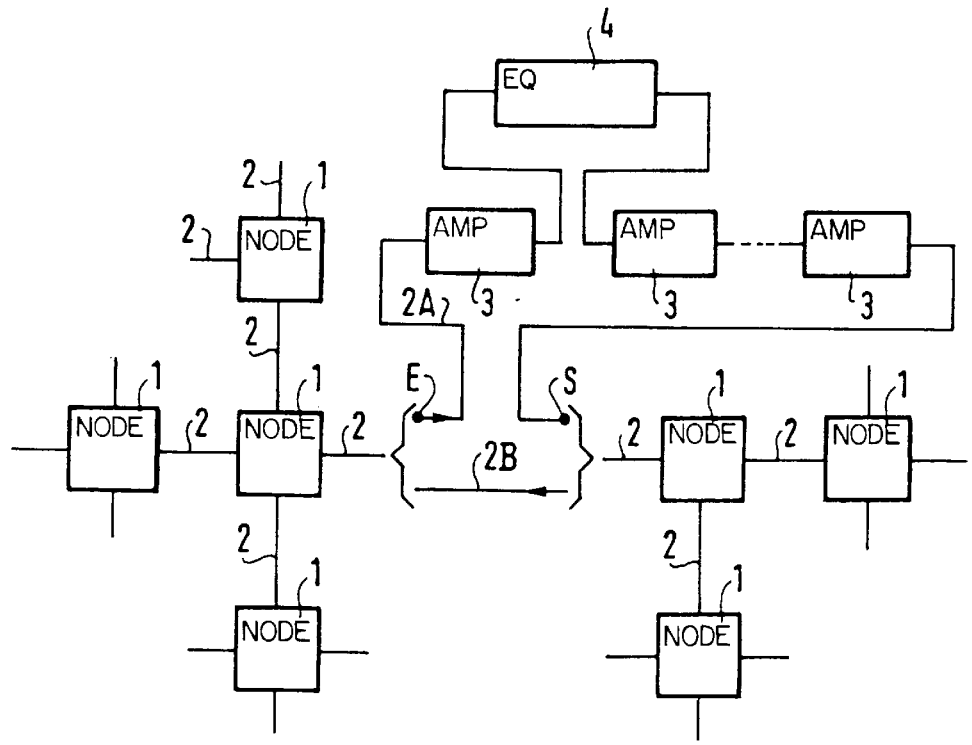
FIG. 1 shows, by way of example, a block diagram indicating the position of an optical equalizer in accordance with the invention in a telecommunication system with long distance transmission links.

The telecommunication system shown in FIG. 1 is made up of a plurality of telecommunication nodes 1 communicating point-to-point with each other and with other nodes, not shown, via transmission links 2. The transmission links 2 are each made up of at least one optical link and more generally by at least two unidirectional optical links providing transmission in opposite directions, two of these opposite direction links 2A and 2B being shown for one of the transmission links 2 in FIG. 1. A transmission link 2 is adapted to connect two telecommunication nodes 1 at a great distance from each other. It is therefore necessary to provide optical amplifiers at regular intervals along each optical link constituting the transmission link 2 to counteract attenuation and distortion of the optical signals transmitted. This is symbolically represented in FIG. 1 by a plurality of optical amplifiers 3 distributed along the length of the optical link 2A between an input end E and an output end S of this unidirectional optical link.

Optical links and optical amplifiers exist that can transmit an optical frequency division multiplexed signal made up of channels that can be distinguished from each other. This can be used to transmit over an optical link optical signals, called primary signals herein, that do not necessarily come from the same source on different channels of an optical frequency division multiplexed signal. These primary optical signals, which come from different nodes 2, for example, are combined at the node 2 where the input E of the optical link concerned is located, for example, to form the optical frequency division multiplexed signal transmitted.

It is preferable for the power levels of the signals transmitted by the various channels of the same optical link to be equal or virtually equal, in particular so that the signals are amplified identically when the optical frequency division multiplexed signal that they constitute, attenuated as a result of its transmission, is regenerated by the optical amplifiers spaced along the optical link in question. There is therefore a risk that the power levels of the primary signals constituting an optical frequency division multiplexed signal to be transmitted via an optical link are not as nearly identical as would be desirable. Nor is there anything to prevent the primary signals transmitted simultaneously in the form of a common optical frequency division multiplexed signal along an optical link from having sufficiently different power levels from one level or another along the link, with the consequence that the optical frequency division multiplexed signal transmitted from the input E of the optical link cannot be completely recovered at the output S.

A system for equalizing the power levels of all the channels is therefore provided. This system may comprise one or more optical equalizer modules disposed along the path followed by an optical frequency division multiplexed signal, as required, and therefore along an optical link by means of which the signal is transmitted between two points. This is symbolically represented in FIG. 1 by the presence of an optical equalizer module 4 between two of the optical amplifiers 3 on the unidirectional optional link 2A between its input E and its output S.

In practise, and in particular in the type of implementation considered here, an optical equalizer module 4 is preferably located at the level of an optical amplifier 3 with which it is associated, between two successive sections of the optical link in question and thus at one end of each of those two sections. It would naturally be feasible to associate an optical equalizer module 4 with each optical amplifier 3, but it is clear that this would usually be superfluous.

Figure 2:
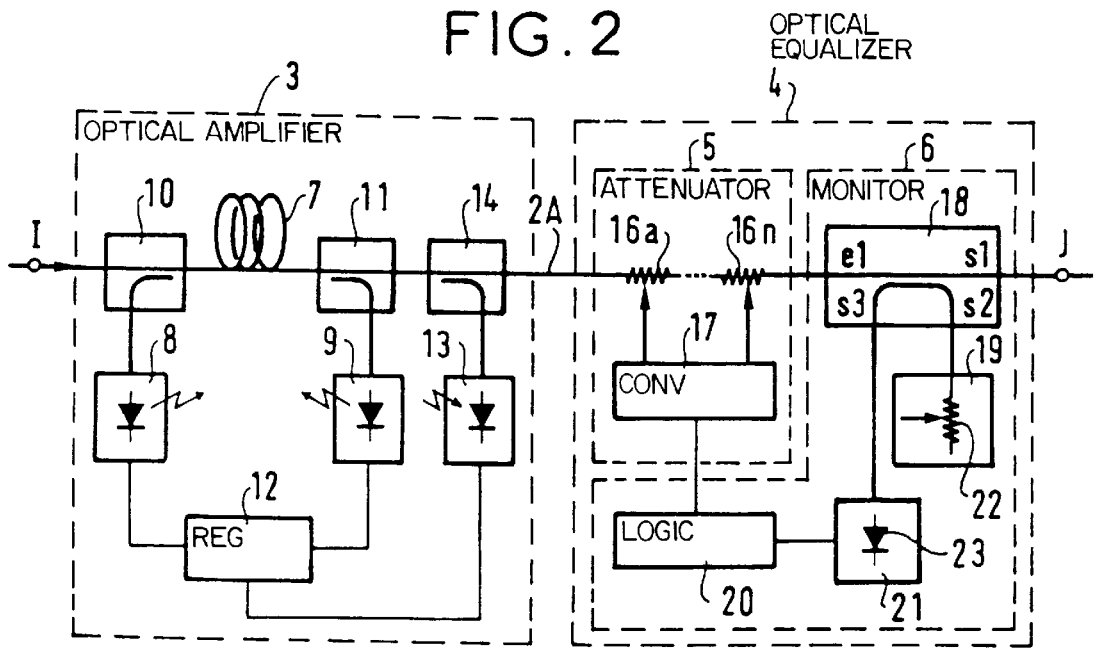
FIG. 2 shows, by way of example, a block diagram of a transmission link arrangement incorporating an optical equalization system module of the invention.

As previously mentioned, FIG. 2 shows one example of a modular arrangement more particularly intended to equip a unidirectional link such as the link 2A of a transmission link 2, at a point of that optical link through which propagates an optical frequency division multiplexed signal comprising a plurality of separate channels. There may be 16 of these channels, for example, respectively corresponding to waves with center wavelengths between 1 530 nm and 1 560 nm, these center wavelengths being regularly spaced, for example, the spacing corresponding to a value chosen between 0.3 nm and 4 nm, for example.

The optical link 2A includes around 100 amplifiers 3 for regenerating the optical frequency division multiplexed signal transmitted regularly distributed along its length, for example.

The arrangement shown in FIG. 2 includes one of these optical amplifiers 3 inserted between two successive sections of the optical link 2 in order to receive the optical frequency division multiplexed signal from a first of these sections via an input connected to a point I of the link. The optical frequency division multiplexed signal regenerated by the optical amplifier 3 is then injected from an output of that amplifier into a point J in the second of the above-mentioned sections of the optical link 2A for onward transmission.

The arrangement shown in FIG. 2 further includes an optical equalizer module 4 including an optical attenuator 5 associated with a monitoring device 6 which determines power levels for the various channels of the optical frequency division multiplexed signal it receives.

In the example given, the optical attenuator 5 and the monitoring device 6 are inserted in series between the optical frequency division multiplexed signal output of the amplifier 3 and the point J mentioned above. A unidirectional optical isolator, not shown, may be inserted between the optical attenuator 5 and the monitoring device 6 to prevent any transmission to that attenuator of any unwanted reflections that may occur in the monitoring device.

It is feasible to arrange the three components of the arrangement referred to above, namely the optical amplifier 3, the optical attenuator 5 and the monitoring device 6, in a different way, if necessary.

The optical amplifier 3 is an erbium-doped fiber 7, for example, adapted to amplify an optical frequency division multiplexed signal received from the point I. This amplification is effected in response to the action of a pump source typically comprising two laser diodes 8 and 9 that inject two pump waves into the fiber 7 through two multiplexers 10 and 11 on respective opposite sides of the fiber 7 onto the path through the amplifier 3 of the optical frequency division multiplexed signal. A regulator 12 provides a supply current to the laser diodes 8 and 9 in accordance with control signals enabling regeneration of the optical frequency division multiplexed signals by appropriate amplification.

In the example given, the control signals provided by the regulator 12 are at least in part deduced from measurements effected by means of a photodetector diode 13 receiving a regulation optical signal captured by an optical coupler 14 and driving an electrical amplifier arrangement, not shown, in the regulator 12. The optical coupler 14 is on the downstream side of the coupler 11 in order to receive the amplified optical signal.

In the arrangement proposed here, the optical attenuator device 5 of the invention receives the optical frequency division multiplexed signal regenerated by the optical amplifier 3.

A unidirectional optical isolator, not shown, may be inserted between the optical attenuator 5 and the optical amplifier 3 to prevent any transmission to that amplifier of any unwanted reflections that may occur in the attenuator.

As already mentioned, the optical attenuator 5 may be placed at some other point through which the optical frequency division multiplexed signal passes as it travels along the optical link 2A, for example on the upstream side of an optical amplifier at the input of the optical link 2A, or on the far side of a monitoring device 6.

In a preferred embodiment the optical attenuator device 5 includes tunable filters, preferably of the light refracting type, for example filters 16a and 16n, disposed in series between an input and an output of the device and each of which is adapted to attenuate an individual channel. This attenuation is obtained by operating on the transmission coefficient by shifting the Bragg wavelength of the light refracting grating of a filter, for example the filter 16a, relative to the center wavelength of the channel the power level of which is to be reduced by means of that filter.

In a preferred embodiment the light refracting grating of each filter is etched into at least one optical waveguide structure, for example an optical fiber, in which the optical frequency division multiplexed signal travels. In a preferred embodiment the filters are divided between a plurality of waveguide structures so that they can easily be tuned separately. Each of the filters 16a through 16n is tuned mechanically or by thermal means, in accordance with measurements carried out channel by channel by the monitoring device 6. A converter 17 receives the information provided by the monitoring device 6 in electrical form and acts on the filters accordingly.

This action can be obtained by mechanical deformation or by modification of the temperature of the fiber in the areas of the fiber in which the light refracting gratings are formed. The temperature of this area of the fiber can be modified by means well known to the person skilled in the art.

The tuning of a filter by mechanical deformation can be obtained by application of pressure, for example by means of a piezo-electric device, to the area of the fiber carrying the Bragg grating constituting the filter.

A filter can also be tuned by mechanical deformation as described in French patent application 94/09705. For example, it can be tuned by lengthening a length of fiber on which the Bragg grating of a filter is etched, this length of fiber being attached to a support to which traction loads can be applied to lengthen it and thereby increase the pitch of the Bragg grating it carries. A similar result can be obtained with a length of fiber attached to a support the curvature of which is modified by application of transverse mechanical pressure. This variation of curvature varies the length of the length of fiber concerned and consequently varies the pitch of the Bragg grating etched on the length of fiber.

This enables selective reduction of the power levels of channels having power levels that are high compared to weaker signals. In a preferred attenuation method, explained in more detail below, the various channels have their power levels reduced identically except for that with the lowest power level.

The monitoring device 6 is adapted to sample a small portion, for example 1%, of the optical signal supplied to it, from the output of the optical attenuator 5, for example. The sampling is effected by an optical coupler 18 which is made, for example, by coupling the cores of two optical fibers, for example by fusing them in an area in which the coupling occurs. The major part of the optical frequency division multiplexed signal received by this optical coupler 18 at an input e1 is transmitted to a direct output port s1 and via the output of the optical equalizer module 4 that contains it to the point J of the optical link 2A for onward transmission of the signal.

The monitoring device 6 also includes extraction filter means 19 that receive the small optical signal portion sampled by the optical coupler 18 via a direct branch output s2 in order to extract the parts of that portion that correspond to the various channels of the optical frequency division multiplexed signal transmitted.

These means comprise, for example, a tunable light refracting filter, not shown, that can be similar to the tunable filters 16a, 16n mentioned above and which is controlled by control logic 20 specific to the optical equalizer module 4, in this example, but which may be shared, for example by this module 4 and by the associated optical amplifier 3, at the level of the regular 12, for example.

The monitoring device 6 further includes optical power measuring means 21 for defining the optical power level for each of the channels part of which has been extracted by the filter means 19 from the optical signal portion sampled by the optical coupler 18.

The optical power measuring means 21 are of the photodetector type, for example. In the example referred to above in which the extraction filter means 19 comprise a tunable light refracting filter 22 connected to the direct branch output s2 of the optical coupler 18, the optical power measuring means 21 comprise a single photodetector 23 which receives via a reflex port s3 of the optical coupler 18 all optical signals refracted by the tunable light refracting filter 22. This photodetector 23 then supplies a signal in electrical form to the control logic 20 according to the power level of the signal that it receives for a given setting of the light refracting filter 22 to which it is optically coupled. The control logic 20 operates on the light refracting filter 22 in a manner that corresponds to that in which it operates on the filters 16a, 16n to modify their tuning, as required.

An optical frequency division multiplexed signal comprising n channels and passing through an optical equalizer module 4 as described above can be equalized by the following method. If necessary, this process can be repeated until the required result is obtained.

Firstly, the optical power measuring means 21 determine the power level for each of the n channels of the signal received by the optical equalizer module 4. The n power levels are successively measured by the photodetector 23 if the optical power measuring means 21 include only the one photodetector. To this end the tunable light refracting filter 22 of the extraction filter 19 is successively tuned in order to reflect successively each of the parts specific to each of the n channels of the small portion of the optical frequency division multiplexed signal sampled by the optical coupler 18. Each of these n parts centered on the center frequency of a different channel is transmitted via the optical coupler 18 to the photodetector 23 from the tunable light refracting filter 22 which is therefore specifically and successively tuned under the control of the control logic 20 to select and to retransmit each part in the opposite direction.

It is of course feasible to implement an optical equalizer module 4 which produces power levels for the n channels of the same signal simultaneously, as mentioned above.

The power levels measured during one and the same operation for the n channels of an optical frequency division multiplexed signal by the optical power measuring means 21 are transmitted to the control logic 20 which includes hardware and software enabling it to process them, for example to classify the channels in accordance with their respective power levels or to determine which of the n channels simultaneously or virtually simultaneously measured has the lowest power level.

When the control logic 20 determines which channel of a received signal has the lowest power level, it also determines the difference $\Delta p$ between this lowest level and an average power level Pavg obtained from the power levels of the other channels. It then controls the filters 16a through 16n of the optical attenuator 5 so that each of them introduces an attenuation corresponding to the value of the difference $\Delta p$ determined in this way into the n−1 channels other than that with the lowest power level of the optical frequency division multiplexed signal propagated by the optical attenuator device to the point J on the optical link 2A for onward transmission.

As already mentioned above, this process operation can be repeated if necessary. In a preferred embodiment, the control logic 20 can interrupt the equalization process as soon as the difference Δp determined is less than an end of operation threshold value and resume it as soon as this difference exceeds a restart threshold value, which may be the same as the previous threshold value.

Of course, the control logic 20 can instead attenuate only some of the n channels of an optical frequency division multiplexed signal if a plurality of channels have simultaneous individual power levels that could be considered to correspond in practise to the lowest level determined at that time.

Alternatively, the control logic 20 and the optical attenuator device 5 can be organized to make it possible to obtain different attenuations for the channels of an optical frequency division multiplexed signal having the highest power levels, if those levels could be considered to belong to different power level sub-ranges of the range of optical power levels provided for the channels. For example, two different levels of attenuation could be provided if two power level sub-ranges could be determined for the channels for which attenuation is envisaged.

If, as shown in FIG. 1, the same optical link, for example the link 2A, includes a plurality of optical amplifiers 3 regularly spaced along its length and at least one optical equalizer module 4 inserted between two of these optical amplifiers, there is provision for exploiting the amplification capabilities of at least one of the optical amplifiers on the downstream side of an equalizer module 4 to raise the power level of the optical frequency division multiplexed signal transmitted by an equalizer module 4 to the intended nominal level, if required. In the case of introducing attenuation for purposes of equalization into one or more channels of the optical frequency division multiplexed signal passing through an equalizer module 4, the level of the optical frequency division multiplexed signal can be attenuated so that it is below a nominal level for the link. This attenuated level is then raised by the optical amplifier(s) 3 on the output side of the optical equalizer module 4 in question as far as the amplifier at which the intended nominal level is obtained.

There is claimed:

1. A method of equalizing respective power levels of channels of an optical frequency division multiplexed signal, including the following operations:

determining the power level of each channel of said optical frequency division multiplexed signal;

introducing attenuation into the channels having power levels that are high relative to a reference level corresponding either to the power level of the channel having the lowest power level or to a level determined from the power levels of the channels having power levels near to that of said channel having the lowest power level, the attenuation applied to said channels having high power levels corresponding to the difference between a power level deduced from the power levels of said channels having high power levels and said reference level.

2. The method claimed in claim 1 wherein the attenuation applied to said channels having power levels that are high relative to said reference level consisting of the power level of said channel having the lowest power level corresponds to the difference between an average power level determined from the power levels of said channels having high power levels and said reference level.

3. The method claimed in claim 2 wherein attenuation is applied to all of the channels except for said channel having the lowest power level corresponding to the difference between an average power level determined from the power levels of the channels other than said channel having the lowest power level and said reference power level consisting of said lowest power level.

4. A system for equalizing power levels of channels of an optical frequency division multiplexed signal received and transmitted, including at least one optical equalizer module including:

means for measuring optical power levels of channels of an optical frequency division multiplexed signal that said module receives and transmits;

processing means for determining which channel of the received optical signal has the lowest power level for the purpose of determining a reference level corresponding either to said lowest power level or to a level determined from channels having power levels near said lowest power level, to determine at least one attenuation value to be applied to said channels having high power levels from the difference between a power level deduced from the power levels of said channels having high power levels and said reference level, if said difference is greater than a given threshold value;

variable attenuation means controlled by said processing means and adapted to operate separately on the power levels of the optical signal channels and to introduce the attenuation determined by said processing means into each of the channels for which high power levels have been measured, said measuring means being connected to said processing means to which they supply the measured power level of each channel, said processing means being connected to said attenuator means via interface means for operating on said attenuation means so that all of the channels are finally at a power level that is at least approximately the same, on the downstream side of said attenuation means.

5. A system as claimed in claim 4 including an optical equalizer module the attenuation means of which include at least one tunable light refracting filter the center frequency of which is variable so that it can be tuned by said processing means over a range of wavelengths corresponding to those of the channels of the optical frequency division multiplexed signal that is received and transmitted by the link including that module.

6. A system as claimed in claim 4 including an optical equalizer module the attenuation means of which include a tunable light refracting filter for each channel, each filter having a center frequency that is variable so that it can be tuned by said processing means over a range of wavelengths corresponding to at least a part of that shared by the channels of the optical frequency division multiplexed signal that is received and transmitted by the link including that module.

7. A system as claimed in claim 5 including an optical equalizer module the attenuator means of which include one or more tunable Bragg light refracting filter(s).

8. A system as claimed in claim 6 including an optical equalizer module the attenuator means of which include one or more tunable Bragg light refracting filter(s).

9. A system as claimed in claim 4 including an optical equalizer module the attenuation means of which include tunable light refracting filters, for example Bragg filters, disposed in series along an optical waveguide structure, for example of the fiber type.

10. A system as claimed in claim 9 including an optical equalizer module the attenuator means of which include tunable light refracting filters, for example Bragg filters, disposed in series and distributed between a plurality of waveguide structures, for example a plurality of optical fibers, so that they can be individually tuned by mechanical deformation or by variation of the temperature or structure of the fiber carrying them.

11. A system as claimed in claim 10 including an optical equalizer module the attenuator means of which include tunable light refracting filters, for example Bragg filters, distributed between waveguide structures, for example optical fibers, associated with interface means enabling them to be deformed selectively, by stretching or by pressure, under the control of said processing means, in order to vary the tuning of said filters.

12. A system as claimed in claim 4 including an optical equalizer module the means in which for measuring the respective optical power levels of the channels of the optical frequency division multiplexed signal received include:

an optical coupler for sampling by coupling a small portion of the optical frequency division multiplexed signal received and to be monitored;

filter means for extracting the part corresponding to each channel in a sampled signal portion that comprise at least one light refracting filter the center frequency of which is variable so that it can be tuned over a range of wavelengths corresponding to those of the channels of the optical frequency division multiplexed signal received and transmitted by the link including said module;

and optical power measuring means that comprise at least one photodetector associated with the or one of the tunable light refracting filter(s) via the optical coupler which samples a portion of said optical frequency division multiplexed signal to measure the optical power level for each channel in the sampled signal portion.

* * * * *